(12) United States Patent
Starr et al.

(10) Patent No.: US 6,307,899 B1
(45) Date of Patent: Oct. 23, 2001

(54) METHOD AND SYSTEM FOR OPTIMIZING CODING GAIN

(75) Inventors: Thomas J J Starr, Barrington, IL (US); Michael John Rude, Minnetonka; Joseph Martin Charboneau, Plymouth, both of MN (US)

(73) Assignee: Ameritech Corporation, Hoffman Estates, IL (US)

( * ) Notice: Subject to any disclaimer, the term of this patent is extended or adjusted under 35 U.S.C. 154(b) by 0 days.

(21) Appl. No.: 09/098,217

(22) Filed: Jun. 16, 1998

(51) Int. Cl.$^7$ .............................. H03D 1/00; H04L 27/06
(52) U.S. Cl. ............................................ 375/340; 375/227
(58) Field of Search .................................... 375/225, 227, 375/265, 262, 341, 372, 340; 714/791, 795, 796, 708

(56) References Cited

U.S. PATENT DOCUMENTS

| | | | |
|---|---|---|---|
| 4,240,156 | * 12/1980 | Doland | 714/791 |
| 4,677,625 | 6/1987 | Betts et al. . | |
| 4,905,256 | 2/1990 | Laurent . | |
| 4,998,253 | 3/1991 | Ohashi et al. . | |
| 5,162,812 | 11/1992 | Aman et al. . | |
| 5,274,674 | * 12/1993 | Lafon | 375/317 |
| 5,319,649 | * 6/1994 | Raghavan et al. | 714/780 |
| 5,388,124 | 2/1995 | Laroia et al. . | |
| 5,481,567 | 1/1996 | Betts et al. . | |
| 5,541,955 | 7/1996 | Jacobsmeyer . | |
| 5,559,561 | 9/1996 | Wei . | |
| 5,574,751 | 11/1996 | Trelewicz . | |
| 5,596,420 | 1/1997 | Daum . | |
| 5,596,604 | 1/1997 | Cioffi et al. . | |
| 5,859,874 | * 1/1999 | Wiedeman et al. | 375/267 |

OTHER PUBLICATIONS

Paper entitled *Advantages of Sequential Decoding for HDSL2*, George Zimmerman, Feb. 3–7, 1997.

* cited by examiner

Primary Examiner—Chi Pham
Assistant Examiner—Phuong Phu
(74) Attorney, Agent, or Firm—Brinks Hofer Gilson & Lione; Jason C. White

(57) ABSTRACT

A method and system for optimizing coding gain that alters the backsearch buffer length and/or the input buffer length of a decoder in response to one or more transmission performance characteristics of the system. The performance characteristics are monitored to determine the performance of the system. The measured transmission performance characteristics are used to control the lengths of the backsearch buffer and the input buffer. The measured transmission performance characteristics along with the backsearch length and/or the input buffer length are analyzed and compared with simulated decoding results. In accordance with the simulated results, the system determines the optimal size of the backsearch buffer and the input buffer needed to achieve a desired performance target. The system adjusts the size of the backsearch buffer length and/or the input buffer length to equal the determined optimal lengths.

26 Claims, 3 Drawing Sheets

METHOD AND SYSTEM FOR OPTIMIZING CODING GAIN

BACKGROUND

The present invention relates generally to coding systems and more specifically to optimizing the coding gain of a coding system.

Several factors can cause errors within a transmission system, and such errors adversely affect the quality of the transmissions. One source of errors in transmissions is noise present in the transmission channel. The existence of errors due to noise or other factors adversely affects the overall performance of the system. Coding systems are commonly used to improve the overall performance of transmission systems by enabling errors to be detected and corrected. The improved performance of a transmission system due to coding is commonly known as coding gain.

One type of coding system that produces coding gain is forward error correction, which enables errors introduced into a transmission to be corrected by the receiver/decoder. There are costs associated with forward error correction, however, because encoding and decoding increases the time it takes to complete a given transmission. The transmitter requires additional time to effectuate the encoding of a transmission and the receiver requires additional time to decode the transmission. Generally, the decoding process introduces more delay than the encoding process. This time delay from the transmitter across a transmission channel and through the receiver is referred to as latency.

Coding systems used to implement coding schemes, such as forward error correction, exist in many forms. These systems typically include both transmitter/encoders and receiver/decoders. Transmitters/encoders utilize coding schemes such as convolutional coding and block coding to enable forward error correction. Convolutional coding systems continuously encode bits of data by introducing redundant bits that depend on the current input set of data as well as past input sets of data. Block coding systems encode blocks of data that only depend on the current block of input data and have no memory of past input blocks. Both the convolutionally encoded bits and the block encoded bits of data are transmitted via a transmission channel to the decoder.

Sequential decoding is a well known technique for decoding convolutional codes. Typically, sequential decoding is used to decode convolutional codes containing constraint lengths that are greater than 13. Convolutional codes having constraint lengths greater than 13 are not readily decoded by maximum likelihood techniques such as the Viterbi algorithm.

The presence of noise or other error causing factors in a transmission system can be dynamic in that they can change over time. Problems associated with the dynamic nature of these factors are of particular interest to telecommunications system operators. Generally, telecommunications system providers strive to minimize latency throughout their systems while still overcoming the adverse effects of errors resulting from noise or other factors.

In most applications, the latency associated with forward error correction is only a small portion of the overall latency of the system. However, in telecommunications applications, and particularly with reference to digital subscriber lines, the latency associated with forward error correction constitutes a significant portion of the overall latency. Thus, for digital subscriber lines, there is a potential simultaneous need for high coding gain and low latency.

Because of the dynamic nature of error causing factors and the costs associated with coding, it is desirable to utilize a coding system that enables the coding gain to be varied over time.

Coding systems that allow for variable coding gain generally do so by providing encoders and decoders that are both variable. For example, to encode transmissions a coding system may select a single code from a group of several different codes, each of which has a different coding gain and associated latency. The decoder then selects the appropriate decoding algorithm for the selected code. Such approaches require changes to both the transmitter/encoder and receiver/decoder.

In order to adjust such systems, changes must be made to both the encoder and the decoder. The data connection between the encoder and decoder is typically disconnected as the changes are made and then restarted once the changes are complete. This creates an interruption in data transmission which is undesirable for potential users of the system. For example, if a data connection was used to connect a private branch exchange (PBX), an interruption in service to change the encoder and decoder would result in all the current telephone calls within the PBX being dropped.

DETAILED DESCRIPTION OF THE PRESENTLY PREFERRED EMBODIMENTS

Figure 1:
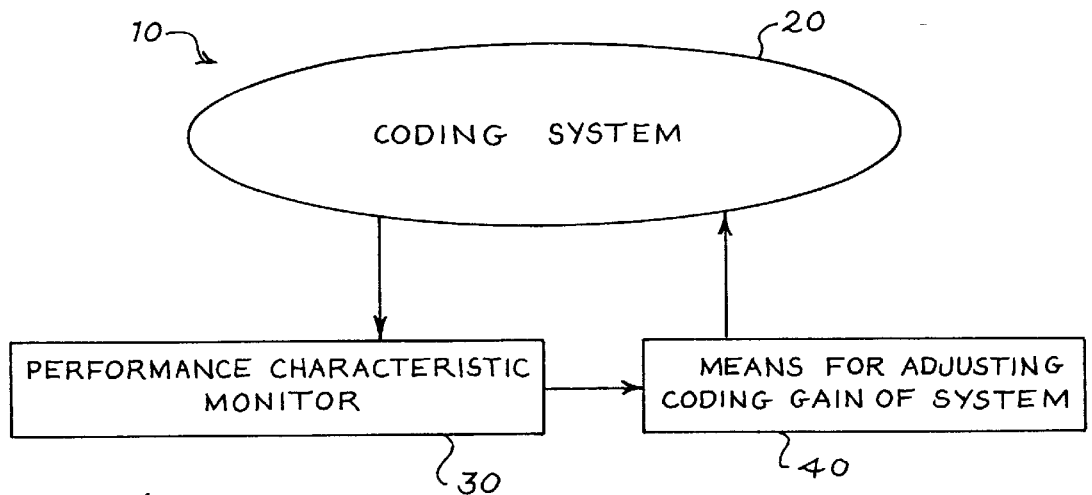
FIG. 1 is a block diagram of a coding system of a preferred embodiment.

By way of example, FIG. 1 depicts a system 10 for optimizing the coding gain of a coding system 20 of a preferred embodiment. The system 10 preferably comprises a coding system 20, a performance characteristic monitor 30 and means for adjusting the coding gain of the coding system 40. The coding system preferably comprises an encoder, a decoder and a transmission channel as known by those skilled in the art. The decoder preferably comprises a variable length input buffer and/or a variable length backsearch buffer as known by those skilled in the art. The performance characteristic monitor 30 preferably comprises a signal to noise ratio (SNR) monitor or a bit error rate (BER) monitor as discussed herein and known by those skilled in the art. Alternatively, any suitable performance characteristic monitor known by those skilled in the art can be adapted for use in the presently preferred embodiments.

The means for adjusting the coding gain of the coding system 40 preferably comprise means for adjusting the size of the variable length input buffer and/or means for adjusting the size of the variable length backsearch buffer. While the means for adjusting the coding gain of the coding system 40 preferably implements the adjustments to the buffer sizes, the means for adjusting the coding gain of the coding system 40 can alternatively provide an output signal that is utilized by another component to implement the adjustments to the buffer sizes. The means for adjusting the coding gain of the coding system 40 is preferably implemented through the use of computer readable program code written in any suitable programming language and implemented on an analog or a digital computer utilizing any suitable operating system. The means for adjusting the coding gain of the coding system 40 can alternatively be implemented through the use of hardware in the form of a hardwired computer, an integrated circuit, or a combination of hardware and computer readable program code.

The system 10 of the present embodiment provides an improved system for optimizing the coding gain of a coding system. The coding gain can be optimized by adjusting the variable length input buffer of the decoder which adjusts the latency afforded the decoder. Alternatively, the coding gain can be optimized by adjusting the variable length backsearch buffer of the decoder. The coding gain can be optimized such that a predetermined performance is minimally achieved without unneeded coding gain. Optimizing the coding gain serves to ensure that the minimally required latency is felt by the system 10. The system 10 monitors performance characteristics to determine the system's overall performance. The system 10 then optimizes the coding gain by altering the size of the buffers of the decoder in response to the system's performance. A primary advantage associated with changing only the size of the buffers in the decoder is that a less complicated and efficient manner of optimizing coding gain results. Furthermore, the change can be made without interrupting data transmissions.

Figure 2:
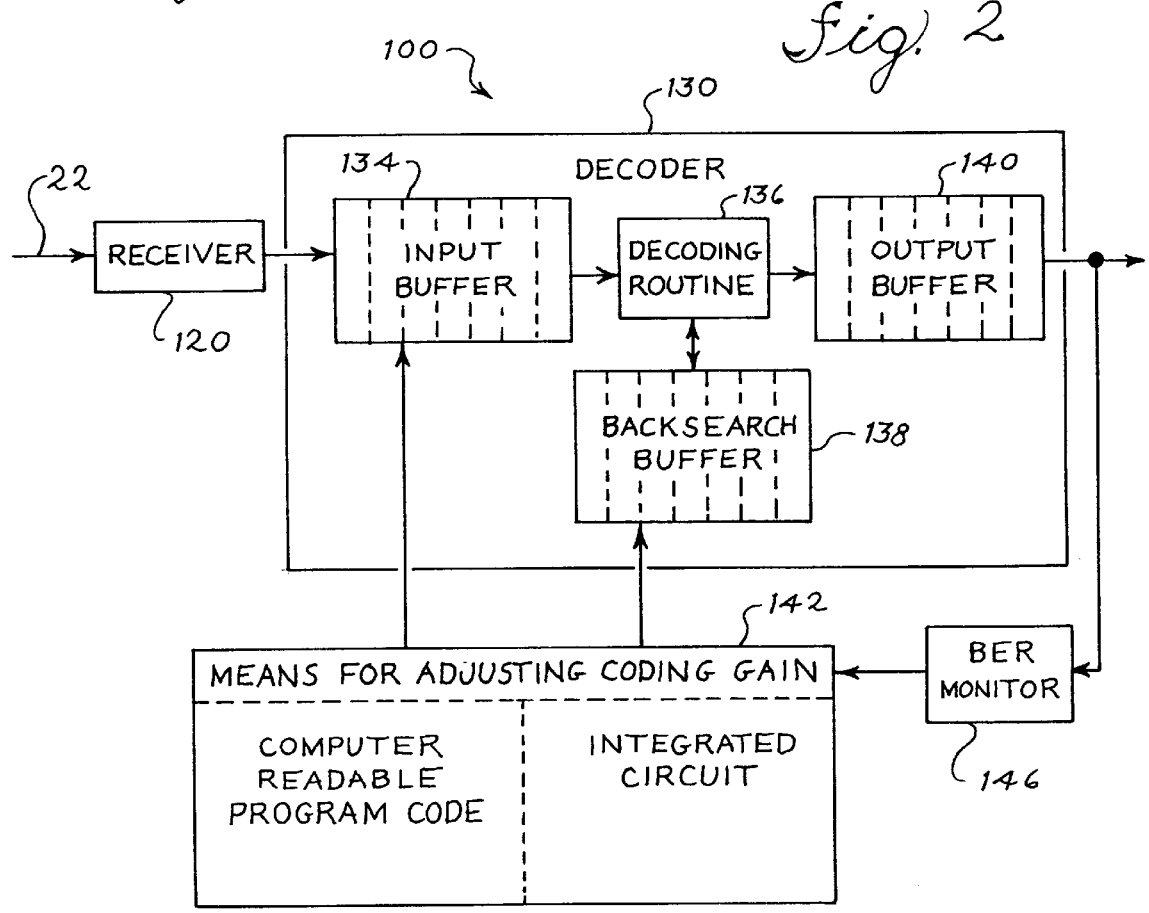
FIG. 2 is a more detailed block diagram of the system depicted in FIG. 1.

By way of further example, FIG. 2 shows a decoding system 100 of a preferred embodiment comprising a receiver 120, a transmission channel 122, a decoder 130, means for adjusting the coding gain of the system 142 and a bit error rate monitor 146. The receiver 120 is coupled to and receives an encoded signal from the transmission channel 122. The receiver 120 converts the encoded signal from its raw physical form into encoded symbols using appropriate demodulation techniques known to those skilled in the art. The encoded symbols are transferred from the receiver 120 to the decoder 130. The decoder 130 is coupled with the transmission channel 122 and decodes the encoded symbols. The bit error rate (BER) monitor 146 is also coupled with the transmission channel 122 and determines a bit error rate of the system 100. The phrase "coupled with," as used herein, means coupled either directly or indirectly via one or more intervening elements.

According to a preferred embodiment, the transmission channel 122 comprises conductive wire. Alternatively, the transmission channel 122 can comprise any form of transmission medium including fiber optic cable, conductive wire or radio wave. In a preferred embodiment, the data received via the transmission channel 122 is encoded by a convolutional encoder.

The decoder 130 preferably comprises a variable length input buffer 134, a decoding routine 136, a variable length backsearch buffer 138 and an output buffer 140. The variable length input buffer 134 comprises a number of memory locations that are utilized at a given time to store encoded symbols that are transferred from the receiver 120. The size of the variable length input buffer 134 is defined by the number of encoded symbols that can be stored within the buffer 134 at given time. The variable length input buffer 134 preferably has an upper limit that is defined by the maximum number of memory locations that can be utilized at a given time. The size of the variable length input buffer 134 can be adjusted to increase or decrease the number of encoded symbols that can be stored at a given time.

The size of the variable length input buffer 134 can contribute to the latency of the decoder 130. As the size of the variable length input buffer 134 increases, the latency potentially afforded the decoder 130 also increases. The coding gain of the system 100 generally increases as the latency of the decoder 130 increases. Thus, increasing the size of the variable length input buffer 134 generally increases the coding gain of the system 100. It is important to note that coding gain cannot be increased without limitation because there is an upper limit on the coding gain for any coding system.

The size of the variable length input buffer 134 is preferably controlled by adjusting means 142, which can be implemented using computer readable program code written in any suitable programming language and implemented on an analog or a digital computer utilizing any suitable operating system. The size can be set through the use of a pointer as known by those skilled in the art. Alternatively, the size of the variable length input buffer 134 can be controlled through the use of hardware in the form of a hardwired computer, an integrated circuit, or a combination of hardware and computer readable program code.

The decoding routine 136 examines the sequence of symbols in the variable length input buffer 134 and compares them to sequences of symbols stored in the variable length backsearch buffer 138. The sequences of symbols stored in the variable length backsearch buffer 138 comprise those sequences that may have been generated by the encoder. The sequence of symbols stored in the variable length backsearch buffer 138 is preferably generated through the use of a path metric calculation as known by those skilled in the art. The decoding routine 136 decodes the symbols into a symbol sequence that is, by some measure, nearest to one that could have been generated by the encoder.

The decoding routine 136 can take many forms. In a preferred embodiment, for shorter constraint lengths, the decoding 136 can comprise a Viterbi decoding routine. The Viterbi decoding routine is optimal in the sense that for a given code it essentially compares the received symbol sequence with all candidate sequences from the encoder. Comparing the received symbol sequence with candidate sequences is commonly referred to as searching paths in a tree, with the tree being the candidate sequences. Since the Viterbi decoding routine examines all paths, it generally produces the best performance. In practice, it is generally not possible to search all paths back to the initial symbol when decoding a continuous transmission. The Viterbi decoding routine searches all paths back to a specified limit, called a backsearch limit. The backsearch limit is preferably implemented as the variable length backsearch buffer 138 as described herein.

In an alternate embodiment, for longer constraint lengths, the decoding routine 136 can comprise a sub-optimal decoding routine such as sequential decoding routine. A sequential decoding routine also has a finite backsearch limit. However, due to its structure, the sequential decoding routine does not examine all paths as the Viterbi decoding routine does. Because the sequential decoding routine is a sub-optimal decoding routine, for a given code it will generally have performance lower than the Viterbi decoding routine. Generally, sequential decoding routines share some common parameters such as an input buffer length, a backsearch limit and a speed factor. Generally, the larger the input buffer length, the more time the sequential decoding routine has to search candidate paths in the tree. Accordingly, an increase in the input buffer length results in an increase in the coding gain of the system. The backsearch limit limits how deep into the tree the sequential decoding routine can search. An increase is the backsearch limit also results in a increase in the coding gain of the system. The input buffer length is preferably implemented as the variable length input buffer 134 as described herein. The backsearch limit is preferably implemented as the variable length backsearch buffer 138 as described herein.

The decoding routine 136 is preferably implemented through the use of computer readable program code written in any suitable programming language and implemented on an analog or a digital computer utilizing any suitable operating system. Alternatively, the decoding routine 136 can be implemented using hardware in the form of a hardwired computer, an integrated circuit, or a combination of hardware and computer readable program code.

The variable length backsearch buffer 138 comprises a number of memory locations that are utilized by the decoding routine 136 at given time. The variable length backsearch buffer 138 stores sequences of symbols for use by the decoding routine 136. The size of the variable length backsearch buffer 138 determines how many symbol sequences can be stored therein and ultimately determines how many comparisons can be made by the decoding routine 136. The variable length backsearch buffer 138 preferably has an upper limit that is defined by the maximum number of memory locations that can be utilized at a given time. The size of the variable length backsearch buffer 138 potentially affects the coding gain of the decoder 130.

The size of the variable length backsearch buffer 138 is preferably controlled through the use of computer readable program code written in any suitable programming language and implemented on an analog or a digital computer utilizing any suitable operating system. The size can be set through the use of a pointer as known by those skilled in the art. Alternatively, the size of the variable length backsearch buffer can be controlled through the use of hardware in the form of a hardwired computer, an integrated circuit, or a combination of hardware and computer readable program code.

The output buffer 140 preferably comprises a number of memory locations. The output buffer 140 queues the decoded symbols before they are processed or converted to the eventual output bitstream. The size of the output buffer 140 depends on the specific implementation. The size of the output buffer 140 typically does not appreciably affect the latency of the system 100.

The bit error rate monitor 146 determines the bit error rate (BER) of the transmission system. BER is defined as the relative frequency of error bits to correct bits. For example, a BER of $10^{-7}$ means that, on average, there will be one bit error for every 10 million bits that are received. The BER is preferably determined though the use of a cyclic redundancy check (CRC) in the encoded symbols. A CRC enables a bit error rate monitor to determine when errors in the decoded symbols occur. By monitoring the errors identified through the use of the CRC over a period of time, the BER of the system 100 can be determined. BER can be determined through the use of a variety of other techniques as known by those skilled in the art. Any suitable method of determining BER can be adapted for use in the presently preferred embodiments.

The BER monitor 146 preferably generates a control signal that varies as a function of the measured BER. The control signal can take many forms. The control signal can be based in-whole or in-part on the BER. The control signal can be analog or digital and linear or non-linear as known by those skilled in the art. Alternatively, the control signal can be binary such that the control signal produced is greater than or less than a threshold value. The BER monitor 146 preferably determines the BER and generates a control signal continuously. Alternatively, the BER monitor 146 can determine the BER and generate a control signal in a sampled fashion on a random or non-random basis.

The means for adjusting the coding gain of the system 142 receives the control signal generated by the BER monitor 146, calculates a corresponding SNR and optimizes the coding gain of the system 100 in response to the control signal. The coding gain can be optimized by adjusting the size of the variable length backsearch buffer 138, the size of the variable length input buffer 134 or both, as described herein. Accordingly, the means for adjusting the coding gain of the system 142 can comprise means for adjusting the size of the variable length backsearch buffer 138, means for adjusting the size of the variable length input buffer 134 or both. The size of the variable length input buffer 134 and the size of the variable length backsearch buffer 138 are preferably adjusted simultaneously. However, either the size of the variable length input buffer 134 or the size of the variable length backsearch buffer can be individually adjusted to alter the coding gain of the system 100.

The means for adjusting the coding gain of the system 142 is preferably implemented through the use of computer readable program code written in any suitable programming language and implemented on an analog or a digital computer utilizing any suitable operating system. Alternatively, the means for adjusting the coding gain can be implemented through the use of hardware in the form of a hardwired computer, an integrated circuit, or a combination of hardware and computer readable program code.

The size of the buffers 134, 138 are preferably adjusted in response to an analysis of the current BER, simulated test results such as those that are stored in Table 1 and/or a predetermined target performance as discussed below. The means for adjusting the coding gain 142 preferably adjust the size of the buffers 134, 138 by determining the optimal settings for the buffers 134, 138 as defined in Table 1. The means for adjusting the coding gain 142 preferably utilizes simulated test results, such as those shown in Table 1, which are calculated during system design by analyses of decoder simulations as known by those skilled in the art to determine the optimal setting for the buffers 134, 138. The optimal settings are preferably determined, in part, by calculating a SNR based upon the measured BER and current buffer sizes.

Figure 6:
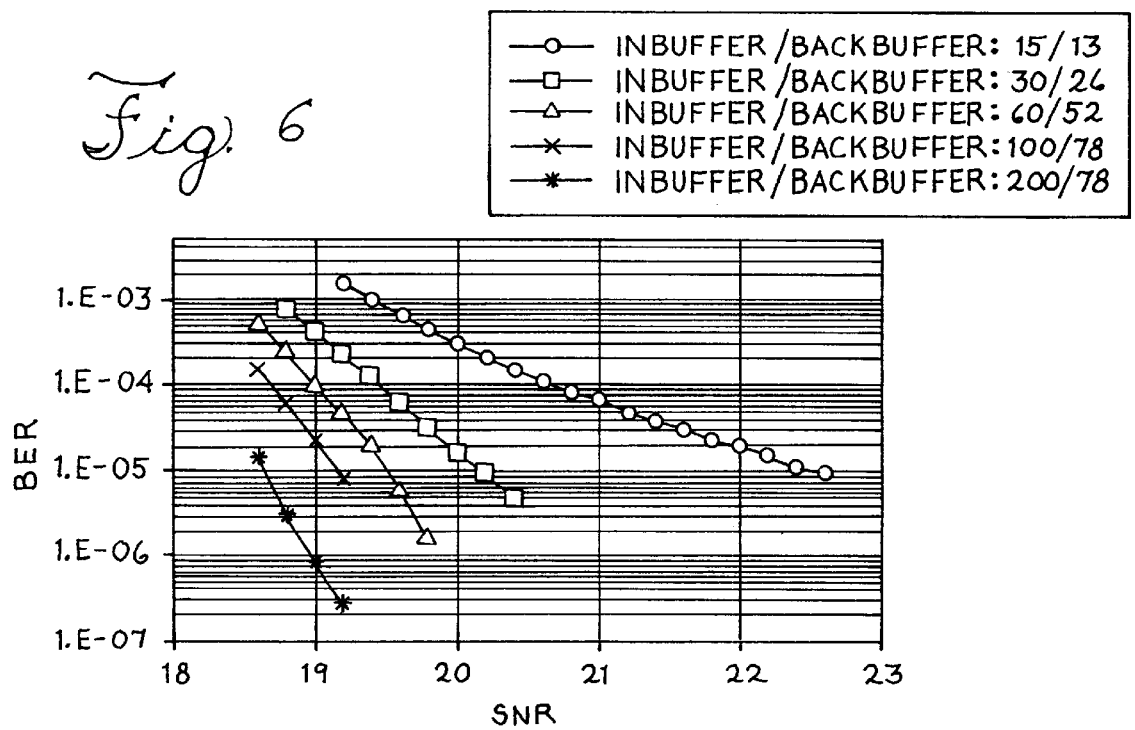
FIG. 6 is a chart depicting performance characteristics of a transmission system of a preferred embodiment.

By way of example, the performance of the decoder 130 is simulated under various conditions and the results of the simulations are stored in a table, such as Table 1, for use by the means for adjusting the coding gain 142 during operation of the system 100. Table 1 is generated from the decoder simulation test results shown in FIG. 6. FIG. 6 shows the results of decoder simulations generated through the use of 2/3 rate trellis code having a constraint length of 13. The decoder simulations utilize the Fano sequential decoding algorithm. The entries in FIG. 6 show the minimum variable length input buffer size that achieves the given BER for a corresponding SNR. It is important to note that the decoder simulation data shown in FIG. 6 is merely one example of representative information. Additional simulation data could be collected and added to or substituted for the data already included in FIG. 6 if required for a specific application.

TABLE 1

| | | SNR[dB] | | |
|---|---|---|---|---|
| | | 19 | 20 | 21 |
| BER | 1.E−03 | 30/26 | 15/13 | 15/13 |
| | 1.E−04 | 60/52 | 30/26 | 15/13 |
| | 1.E−05 | 200/78 | 60/52 | 30/26 |
| | 1.E−06 | 200/78 | 60/52 | |

(In the table, the entry 30/26 represents the Input Buffer Length/Backsearch Buffer Length)

In a preferred embodiment, the simulated decoding results are implemented using a look-up table or grid such as shown in Table 1. The simulated test results can be implemented in a tabular or a database format in computer readable program code written in any suitable programming language and implemented on an analog or a digital computer utilizing any suitable operating system. The simulated test results can also be implemented through the use of hardware in the form of a hardwired computer, an integrated circuit, or a combination of hardware and computer readable program code.

Figure 3:
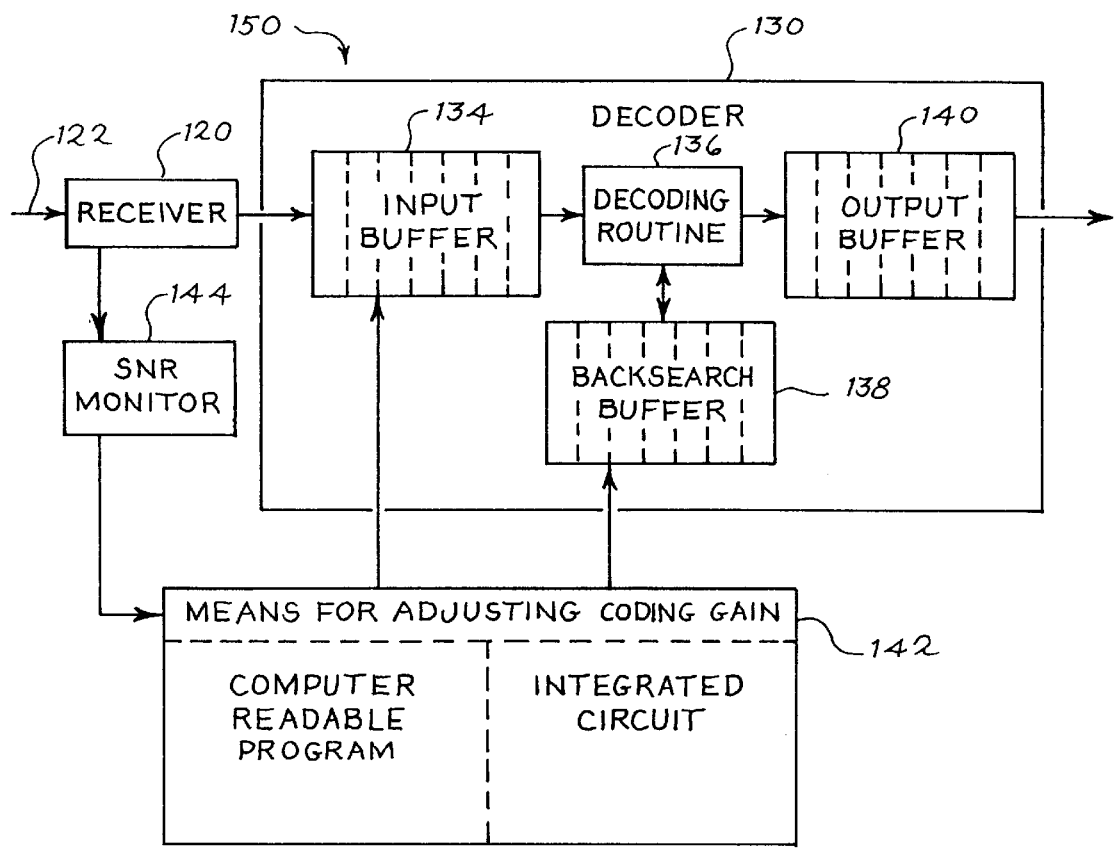
FIG. 3 is a preferred alternative embodiment of the system depicted in FIG. 2.

According to a more preferred embodiment depicted in FIG. 3, the system 150 includes a control signal to noise ratio monitor 144. The signal to noise ratio monitor 144 is coupled with the transmission channel 122 and determines the signal to noise ratio (SNR) for the transmission channel 122. SNR is defined in this example as the ratio of average signal power to average noise power. Both the signal power and the noise power are preferably monitored through the use of the receiver 120 which converts the received encoded signal into encoded symbols. This technique enables the signal and noise powers to be independently estimated. Any suitable method of determining the SNR known by those skilled in the art can be adapted for use in the presently preferred system.

The SNR monitor 144 preferably generates a control signal that varies as a function of the measured SNR The control signal can take many forms. The control signal can be based in-whole or in-part on the SNR. The control signal can be analog or digital and linear or non-linear as known by those skilled in the art. Alternatively, the control signal can be binary such that the control signal produced is greater than or less than a threshold value. The SNR monitor 144 preferably determines the SNR and generates a control signal continuously. Alternatively, the SNR monitor 144 can determine the SNR and generate a control signal in a sampled fashion on a random or non-random basis.

The means for adjusting the coding gain of the system 142 receives the control signal generated by the SNR monitor 144 and optimizes the coding gain of the system 150 in response to the control signal. The coding gain can be optimized by adjusting the size of the variable length backsearch buffer 138, the size of the variable length input buffer 134 or both as described above. Accordingly, the means for adjusting the coding gain of the system 142 can comprise means for adjusting the size of the variable length backsearch buffer 138, means for adjusting the size of the variable length input buffer 134 or both, also as described above.

The means for adjusting the coding gain of the system 142 preferably alter the size of the variable length input buffer 134 and/or the size of the variable length backsearch buffer 138 as discussed above. The adjustments are preferably made as a result of an analysis of the current SNR, simulated test results such as those that are stored in Table 1 and/or a predetermined target performance. The means for adjusting the coding gain 142 preferably determine the optimal size of both the variable length input buffer 134 and the variable length backsearch buffer 138. The means for adjusting the coding gain 142 utilizes the same simulated test results, shown in Table 1, and discussed above.

Figure 4:
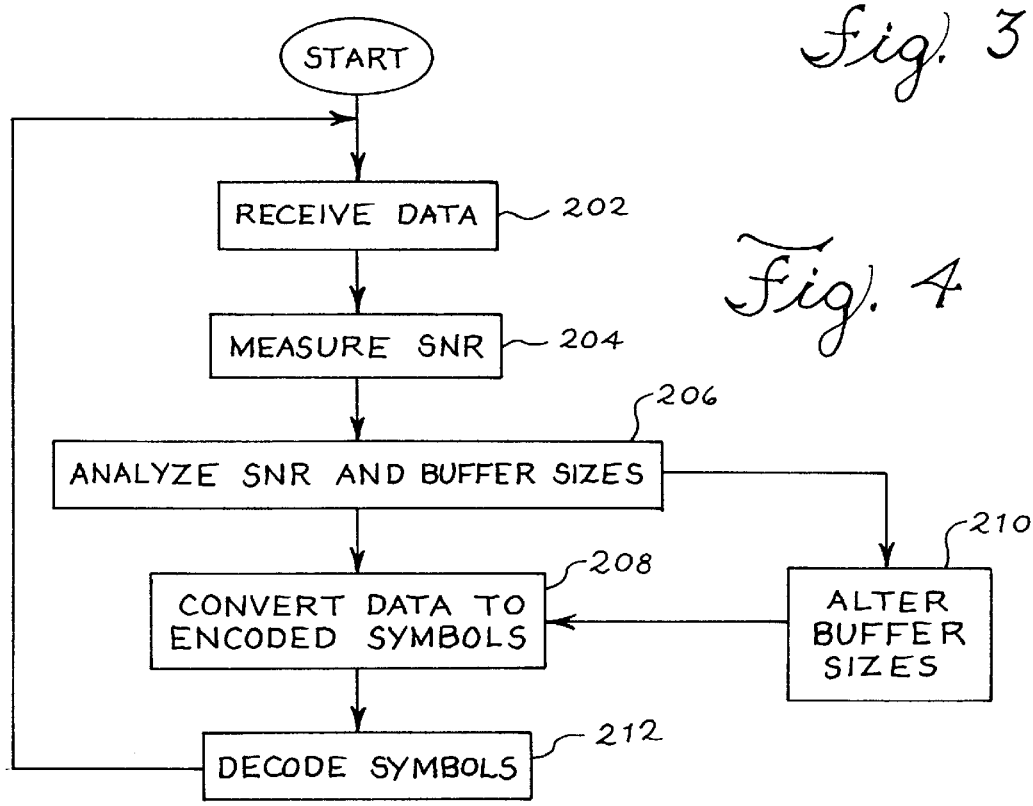
FIG. 4 is a flow chart depicting a method for optimizing coding gain of a preferred embodiment.

The system of FIG. 3 can be used to implement the preferred method of optimizing coding gain depicted in FIG. 4. As the encoded signal is converted to encoded symbols by the receiver 120 (FIG. 4, step 202), the SNR is measured (step 204). The measured SNR and the current size of the variable length input buffer 134 and the current size of the variable length backsearch buffer 138 are analyzed (step 206) to determine the minimum BER that can be achieved by the system 150 as presently configured. If the minimum BER satisfies a predetermined target BER without excessively long buffer lengths, the system 150 is allowed to proceed to the step of converting the data to encoded symbols (step 208). If the minimum BER does not satisfy the target BER, then the size of the variable length input buffer 134 and/or the size of the variable length backsearch buffer 138 are adjusted (step 210) so that the system 150 performance will satisfy the predetermined target performance. The adjustments are made by analyzing the measured SNR and the maximum performance of the different input buffer length and backsearch buffer length combinations as shown in FIG. 6. The combination of input buffer length and backsearch buffer length that yields a BER that is less than the target BER for the measured SNR is then selected. The size of the variable length input buffer 134 and the size of the variable length backsearch buffer 138 are then adjusted to equal the identified combination. This adjustment may increase or decrease the buffer 134, 138 sizes depending upon the circumstances. For example, if the desired BER target is $10^{-5}$ and the measured SNR is 19 dB, then the input buffer length necessary to achieve the target BER is 200 symbols.

After the sizes of the buffers 134, 138 have been adjusted (step 210), the system proceeds to convert the data to encoded symbols (step 208). The encoded symbols are then decoded (step 212). While the above description only details the processing of a single piece of data, data is continually received by the receiver and a plurality of the steps can occur simultaneously with respect to different portions of data as they progress through the process. Accordingly, the system continuously monitors the SNR while simultaneously receiving and decoding data as known to those skilled in the art.

Figure 5:
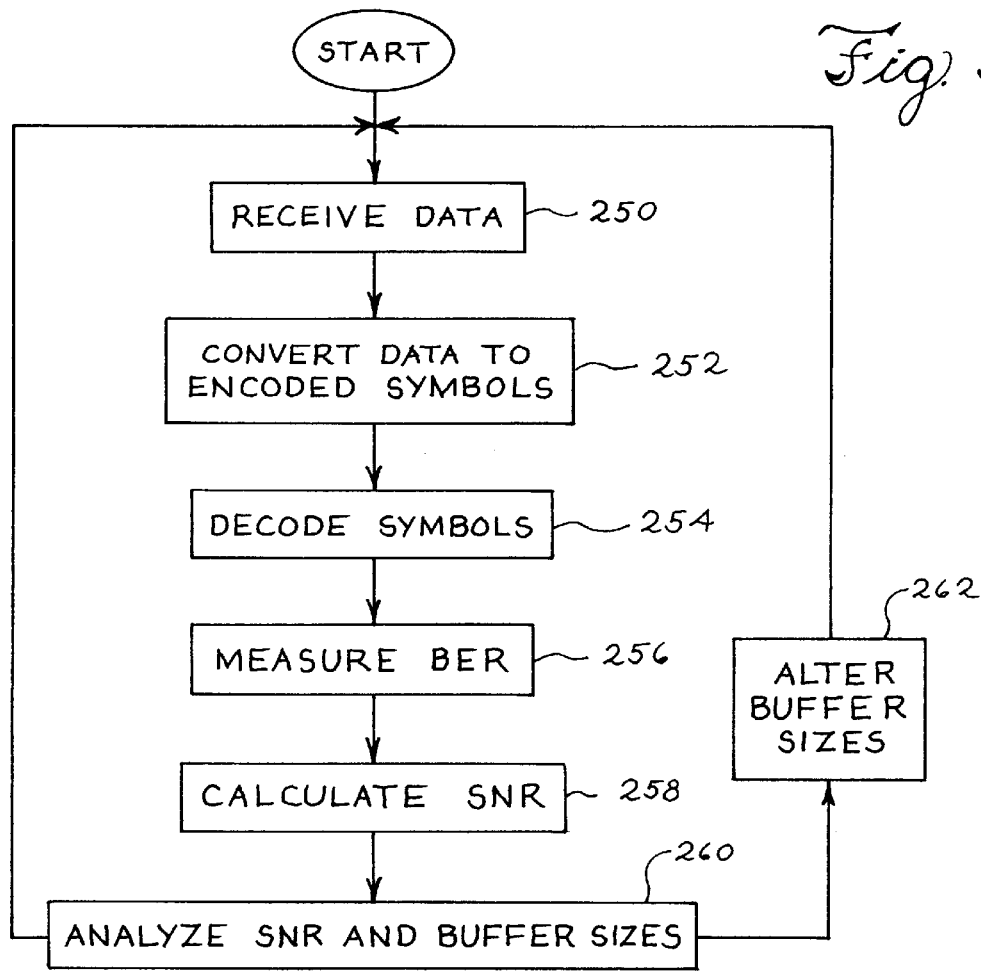
FIG. 5 is an alternative embodiment of the method depicted in FIG. 4.

In an alternate embodiment, the system of FIG. 2 can be used to implement the method for optimizing coding gain shown in FIG. 5. The receiver 120 (FIG. 2) receives encoded data (step 250, FIG. 5). The receiver 120 converts the encoded data into encoded symbols (step 252). The encoded symbols are decoded (step 254) by the decoder 130. A BER monitor 146 measures the BER (step 156) for the system 100. The means for adjusting the coding gain 142 analyzes the current size of the variable length input buffer 134, the current size of the variable length backsearch buffer 138 and the measured BER to determine the current SNR of the transmission channel 122 (step 258). The current SNR is determined by utilizing decoding simulation data such as that shown in Table 1 or FIG. 6. The SNR is then compared to the SNR that is required to meet a predetermined target BER (step 260). The SNR that is required to meet the target BER is determined through the use of decoder simulations as described above. If the measured BER equates to a SNR that satisfies a predetermined performance requirement, the system 100 proceeds to receive the encoded data (step 250).

If the BER does not satisfy the predetermined performance requirement, then the size of the variable length input buffer 134 and/or the size of the variable length backsearch buffer 138 are adjusted (step 262) in response to the calculated SNR and the BER data stored in the table. For example, if the current input buffer length is 60 symbols and the measured BER is $10^{-4}$, then by using the graph the current SNR can be calculated to be 19 dB. If the target BER is $10^{-5}$ and the calculated SNR is 19 dB, the input buffer length necessary to achieve the target BER is also 200 symbols. After the sizes of the buffers 134, 138 are adjusted, the system 100 receives the encoded data (step 250). Preferably, the system 100 continually monitors the BER, and potentially adjusts the buffer 134, 138 sizes as each successive symbol is decoded.

While the above description only details the processing of a single piece of data, data is continually received by the receiver and a plurality of the steps can occur simultaneously with respect to different portions of data as they progress through the process. Accordingly, the system continuously monitors the BER while simultaneously receiving and decoding data as known to those skilled in the art.

According to a preferred embodiment, the coding gain is continually adjusted throughout the operation of the systems 100, 150 as described in the methods depicted in FIGS. 4 and 5. During continuous operation, the coding gain adjustments are preferably done when the BER or SNR warrants such an adjustment. Because BER and SNR are average performance measures, the size of the buffers 134, 138 are preferably adjusted after such a period of time as is necessary to calculate BER or SNR. In an alternate embodiment, the adjustment of the coding gain occurs only at start up.

The step of adjusting the size of the variable length input buffer 134 and/or the size of the variable length backsearch buffer 138 (step 210, FIG. 4, step 262, FIG. 5) is preferably implemented in such a manner that the frequency and phase of an output data clock for the decoder do not exceed specified limits, as known by those skilled in the art. This can be accomplished by limiting changes in the size of the buffers 134, 138 to small increments over time or other techniques known by those skilled in the art. For example, if it were necessary to change from a buffer size of 100 to a buffer size of 200, the length could be increased one unit at a time over a specified time interval. The time interval would be long enough to ensure that the output data clock would not move out of specified frequency and phase limits.

It should be noted that the size of the variable length backsearch buffer 138 is preferably less that the size if the variable length input buffer 134. Additionally, if the decoder's backsearch is not completed by the time the variable length input buffer 134 becomes completely full with incoming encoded symbols, errors will result. Recovery algorithms can be used to return the sequential decoder to a known state after such an error occurs. These algorithms are described in reference texts and are well known to those skilled in the art.

It is to be understood that a wide range of changes and modifications to the embodiments described above will be apparent to those skilled in the art and are contemplated. It is therefore intended that the foregoing detailed description be regarded as illustrative rather than limiting, and that it be understood that it is the following claims, including all equivalents, that are intended to define the spirit and scope of the invention.

We claim:

1. A decoding system comprising:
   a transmission channel;
   a signal to noise ratio monitor coupled with the transmission channel, the signal to noise ratio monitor operative to generate a control signal;
   a decoder coupled with the transmission channel, the decoder comprising a variable length input buffer; and
   means for automatically adjusting the variable length input buffer in response to the control signal.

2. The system of claim 1, wherein the means for automatically adjusting the variable length input buffer in response to the control signal comprise computer readable program code.

3. The system of claim 1, wherein the means for adjusting the variable length input buffer in response to the control signal comprise an integrated circuit.

4. The system of claim 1, wherein the means for automatically adjusting the variable length input buffer in response to the control signal comprise computer readable program code and an integrated circuit.

5. A decoding system comprising:
   a transmission channel;
   a signal to noise ratio monitor coupled with the transmission channel, the signal to noise ratio monitor operative to generate a control signal;
   a decoder coupled with the transmission channel, the decoder comprising a variable length backsearch buffer; and
   means for automatically adjusting the variable length backsearch buffer in response to the control signal.

6. The system of claims 4, wherein the means for adjusting the variable length backsearch buffer comprises computer readable program code.

7. The system of claim 4, wherein the means for adjusting the variable length backsearch buffer comprises an integrated circuit.

8. The system of claim 4, wherein the means for adjusting the variable length backsearch buffer comprises computer readable program code and an integrated circuit.

9. The system of claims 1 or 8, wherein the decoder comprises a Viterbi decoder.

10. The system of claims 1, 4, wherein the decoder comprises a sequential decoder.

11. A method for optimizing coding gain of a system comprising a decoder comprising a variable length backsearch buffer, the method comprising the steps of:
   determining a signal to noise ratio of a transmission channel associated with the decoder; and
   automatically adjusting the variable length backsearch buffer in response to the signal to noise ratio.

12. The method of claim 11, wherein the step of automatically adjusting the variable length backsearch comprises the steps of:
   determining an optimal backsearch buffer length based on simulated decoding results and the signal to noise ratio; and
   automatically adjusting the variable length backsearch buffer to equal the optimal backsearch buffer length.

13. A method for optimizing the coding gain of a system comprising a decoder comprising a variable length backsearch buffer, the method comprising the steps of:
   determining a bit error rate of the system; and
   automatically adjusting the variable length backsearch buffer in response to the bit error rate.

14. The method of claim 13, wherein the step of automatically adjusting the variable length backsearch buffer comprises the steps of:

determining an optical backsearch buffer length based on simulated decoding results and bit error rate; and automatically adjusting the variable length backsearch buffer to equal the optimal backsearch buffer length.

15. A method for optimizing the coding gain of a system comprising a decoder comprising a variable length input buffer, the method comprising the steps of:

determining a signal to noise ratio of a transmission channel associated with the decoder;

automatically adjusting the variable length input buffer in response to the signal to noise ratio.

16. The method of claim 15, wherein the step of automatically adjusting the variable length input comprises the steps of:

determining an optimal input buffer length based on simulated decoding results and the signal to noise ratio; and automatically adjusting the variable length input buffer to equal the optimal input buffer length.

17. A method for optimizing the coding gain of system comprising a decoder comprising a variable length input buffer, the method comprising the steps of:

determining a bit error rate of the system; and automatically adjusting the variable length input buffer in response to the bit error rate.

18. The method of claim 17, wherein the step of automatically adjusting the variable length input buffer comprises the steps of:

determining an optimal input buffer length based on simulated decoding results and the bit error rate; and automatically adjusting the variable length input buffer to equal the optimal input buffer length.

19. A computer usable medium for optimizing the coding gain of a system comprising a decoder comprising a variable length backsearch buffer, the decoder responsive to a transmission channel, the medium comprising:

computer readable program code for receiving a control signal based on a signal to noise ratio of the transmission channel; and computer readable program code for automatically adjusting the variable length backsearch buffer in response to the control signal.

20. A computer usable for optimizing the coding gain of a system comprising a decoder comprising a variable length input buffer, the decoder responsive to a transmission channel, the medium comprising:

computer readable program code for receiving a control signal based on a signal to noise ratio of the transmission channel; and computer readable program code for automatically adjusting the variable length input buffer in response to the control signal.

21. A computer usable medium for optimizing the coding gain of a system comprising a decoder comprising a variable length backsearch buffer, the medium comprising:

computer readable program code for receiving a control signal based upon a bit error rate of the system; and computer readable program code for automatically adjusting the variable length backsearch buffer in response to the control signal.

22. A computer usable medium for optimizing the coding gain of a system comprising a decoder comprising a variable length input buffer, the medium comprising:

computer readable program code for receiving a control signal based upon a bit error rate of the system; and computer readable program code for automatically adjusting the variable length input buffer in response to the control signal.

23. A decoding system comprising:

a transmission channel;

means responsive to the transmission channel, for generating a control signal that varies as a function of a signal to noise ratio of the transmission channel;

a decoder coupled with the transmission channel, the decoder comprising a variable length input buffer; and means for automatically adjusting the variable length input buffer in response to the control signal.

24. A decoding system comprising:

a transmission channel;

means responsive to the transmission channel, for generating a control signal that varies as a function of a signal to noise of the transmission channel;

a decoder coupled with the transmission channel, the decoder comprising a variable length backsearch buffer; and means for automatically adjusting the variable length backsearch buffer in response to the control signal.

25. A decoding system comprising:

a transmission channel;

a decoder coupled with the transmission channel, the decoder comprising a variable length input buffer;

means responsive to the decoder, for generating a control signal that varies as a function of a bit error rate of the system; and means for automatically adjusting the variable length input buffer length in response to the control signal.

26. A decoding system comprising:

a transmission channel;

a decoder coupled with the transmission channel, the decoder comprising a variable length backsearch buffer;

means responsive to the decoder, for generating a control signal that varies as a function of a bit error rate of the system; and means for automatically adjusting the variable length backsearch buffer in response to the control signal.

* * * * *

UNITED STATES PATENT AND TRADEMARK OFFICE
CERTIFICATE OF CORRECTION

PATENT NO. : 6,307,899 B1
DATED : October 23, 2002
INVENTOR(S) : Thomas J. J. Starr et al.

It is certified that error appears in the above-identified patent and that said Letters Patent is hereby corrected as shown below:

<u>Column 10,</u>
Lines 30, 33 and 36, delete "4," and substitute -- 5, -- in its place.
Line 39, delete "1 or 8," and substitute -- 1 or 5, -- in its place.
Line 41, delete "1, 4," and substitute -- 1 or 5, -- in its place.

Signed and Sealed this

Twelfth Day of August, 2003

JAMES E. ROGAN
*Director of the United States Patent and Trademark Office*